(12) United States Patent
Reichert (10) Patent No.: US 7,319,936 B2
(45) Date of Patent: Jan. 15, 2008

(54) INSTRUMENT WITH INTERFACE FOR SYNCHRONIZATION IN AUTOMATIC TEST EQUIPMENT

(75) Inventor: Peter A. Reichert, Thousand Oaks, CA (US)

(73) Assignee: Teradyne, Inc., North Reading, MA (US)

( * ) Notice: Subject to any disclaimer, the term of this patent is extended or adjusted under 35 U.S.C. 154(b) by 264 days.

(21) Appl. No.: 11/063,078

(22) Filed: Feb. 22, 2005

(65) Prior Publication Data

US 2006/0123296 A1 Jun. 8, 2006

Related U.S. Application Data

(60) Provisional application No. 60/630,111, filed on Nov. 22, 2004.

(51) Int. Cl.
*G06F 1/04* (2006.01)

(52) U.S. Cl. .................. 702/125; 702/126; 702/187; 702/189

(58) Field of Classification Search .............. 702/79, 702/85, 104, 117, 118, 182, 189, 125, 126, 702/186; 327/105, 279; 713/500; 714/724
See application file for complete search history.

(56) References Cited

U.S. PATENT DOCUMENTS

| | | | |
|---|---|---|---|
| 4,247,817 A | 1/1981 | Heller | 327/63 |
| 4,660,197 A | 4/1987 | Wrinn et al. | 714/700 |
| 4,816,750 A | 3/1989 | Van der Kloot et al. | 324/73.1 |
| 4,875,210 A | 10/1989 | Russo et al. | 714/743 |
| 5,657,486 A | 8/1997 | Czamara et al. | 712/245 |
| 5,717,704 A | 2/1998 | Rosenfield | 714/736 |
| RE36,063 E | 1/1999 | Conner | 261/102 |

(Continued)

FOREIGN PATENT DOCUMENTS

| | | |
|---|---|---|
| EP | 0 389 683 A2 | 10/1990 |
| EP | 1 146 494 A1 | 10/2001 |
| EP | 1 610 137 A1 | 12/2005 |
| JP | 07-140975 | 6/1995 |
| JP | 07-307772 | 11/1995 |
| WO | WO 03/042710 A2 | 5/2003 |

OTHER PUBLICATIONS

International Search Report for International Patent Application No. PCT/US2005/042473, dated Mar. 30, 2006.

(Continued)

*Primary Examiner*—Eliseo Ramos-Feliciano
*Assistant Examiner*—Felix Suarez
(74) *Attorney, Agent, or Firm*—Wolf Greenfield (57) ABSTRACT

A test system with multiple instruments. Some instruments act as controller instruments and others act as controlled instruments. Each instrument includes a clock generator that synthesizes one or more local clocks from a reference clock. The reference clock is a relatively low frequency clock that can be inexpensively but accurately generated and distributed to all of the instruments. A communication link between instruments is provided. Timing circuits within instruments that are to exchange time information are synchronized to establish a common time reference. Thereafter, instruments communicate time dependent commands or status messages asynchronously over the communication link by appending to each message a time stamp reflecting a time expressed relative to the common time reference. The test system includes digital instruments that contain pattern generators that send command messages to analog instruments, which need not include pattern generators. The architecture simplifies design of analog instruments and avoids redesign of analog instrument as pattern rates of digital instruments change.

20 Claims, 7 Drawing Sheets

U.S. PATENT DOCUMENTS

| | | | |
|---|---|---|---|
| 5,905,967 A | 5/1999 | Botham | 702/118 |
| 6,021,515 A | 2/2000 | Shimura | 714/738 |
| 6,188,253 B1 * | 2/2001 | Gage et al. | 327/105 |
| 6,275,962 B1 | 8/2001 | Fuller et al. | 714/724 |
| 6,389,525 B1 | 5/2002 | Reichert et al. | 711/217 |
| 6,550,029 B1 * | 4/2003 | Bailey et al. | 714/724 |
| 6,553,529 B1 | 4/2003 | Reichert | 714/738 |
| 6,642,754 B1 | 11/2003 | Dobramysl et al. | 327/105 |
| 6,822,498 B1 | 11/2004 | Schroeder et al. | 327/291 |
| 6,976,183 B2 * | 12/2005 | Gage et al. | 713/500 |
| 7,092,837 B1 * | 8/2006 | Lanier et al. | 702/117 |
| 2003/0158706 A1 | 8/2003 | Edison | 702/187 |
| 2004/0003328 A1 | 1/2004 | Viens et al. | 714/724 |
| 2004/0064750 A1 | 4/2004 | Conway | 713/401 |
| 2005/0146360 A1 | 7/2005 | Reichert | 327/105 |

OTHER PUBLICATIONS

International Search Report for International Patent Application No. PCT/US2005/0426591, dated Mar. 30, 2006.
Patent Abstract of Japanese Publication No. 07-30772.
Patent Abstract of Japanese Publication No. 07-140975.
Machine Translation of Japanese Publication No. 07-30772. dated May 19, 2006, pp. 1-13.

* cited by examiner

INSTRUMENT WITH INTERFACE FOR SYNCHRONIZATION IN AUTOMATIC TEST EQUIPMENT

RELATED APPLICATIONS

This application claims priority under 35 U.S.C. § 119(e) to U.S. Provisional Application Ser. No. 60/630,111, entitled "INSTRUMENT SYNCHRONIZATION FOR AUTOMATIC TEST EQUIPMENT," filed on Nov. 22, 2004, which is herein incorporated by reference in its entirety. This case is related to AUTOMATIC TEST SYSTEM WITH SYNCHRONIZED INSTRUMENTS, filed Feb. 22, 2005, which is herein incorporated by reference in its entirety.

FIELD OF THE INVENTION

The invention relates generally to automatic test equipment and more particularly to control of instruments within a test system.

BACKGROUND OF THE INVENTION

Semiconductor devices are tested, often multiple times, during their manufacture. A piece of automatic test equipment, referred to as a "tester," is used to generate test signals that stimulate a device under test (DUT) and to measure the response. The tester determines whether a DUT is operating properly by comparing the response evoked by a carefully controlled test pattern with an expected response.

To fully test devices, the tester should generate and measure signals such as may be found in the operating environment of those devices. Increasing complexity of semiconductor chips has required that automatic test equipment also generate and measure more complex signals. Most semiconductor devices generate or respond to high speed digital signals. Many devices, such as disk drive controllers and processors for video signals, also generate or respond to analog signals. Entire systems, containing both analog and digital electronics, are now widely implemented on single semiconductor devices.

Automatic test equipment must now generate both digital and analog signals. Accordingly, test equipment is typically made to contain multiple instruments. Each instrument performs a specific function, such as generating high speed digital signals or producing an analog waveform that has a programmed characteristic. Multiple instruments are installed in a tester to provide the combination of analog and digital signals needed to test a particular device. Creating instruments that provide separate test functions provides a flexible way to create a test system that can generate and measure a set of test signals required for testing virtually any semiconductor device.

However, assembling a test system from separate instruments creates an additional challenge for test system designers because the actions of the various instruments must be coordinated. For a test system to properly evaluate test results on a semiconductor device, it is often necessary for the tester to determine both that a specific signal was detected and that the signal occurred at a specific time in relation to a certain stimulus. Coordinated operation of the instruments is necessary for signals to be generated and measured with specific time relationships.

One way to coordinate instruments is to provide centralized circuitry that provides a reference clock and commands to all instruments. A circuit in a tester that provides a series of commands to control the generation and measurement of test signals is called a "pattern generator."

There is often a practical limit to the frequency of a reference clock that can be reliably fanned out to many instruments in a test system, which can be undesirable. Events that are timed relative to edges of a clock may be specified with a resolution limited by the period of the clock. Lower frequency clocks have longer periods and therefore provide less timing resolution.

Where greater timing resolution is desired, it is known to use an "interpolator." An interpolator is a circuit that can track an interval that is a fraction of a period of a clock. However, interpolators must be accurate and stable. Designing and building interpolators in a test system therefore presents complexities not present when times are measured relative to a digital clock.

A variation on the approach of using a centrally created clocking architecture is employed in the Catalyst™ mixed-signal semiconductor test system, manufactured by Teradyne, Inc., of Boston, Mass. The architecture is shown generally in FIG. 1 and includes a reference clock generator 8 that generates a clock that is distributed, or fanned out, to a plurality of digital and analog channel cards 10 and 12, respectively. Each analog or digital card may be considered a separate instrument, though it should be appreciated that an instrument is a logical concept and that an instrument may be implemented on multiple circuit cards or, alternatively, may be implemented on a single circuit card along with other circuitry.

Figure 1:
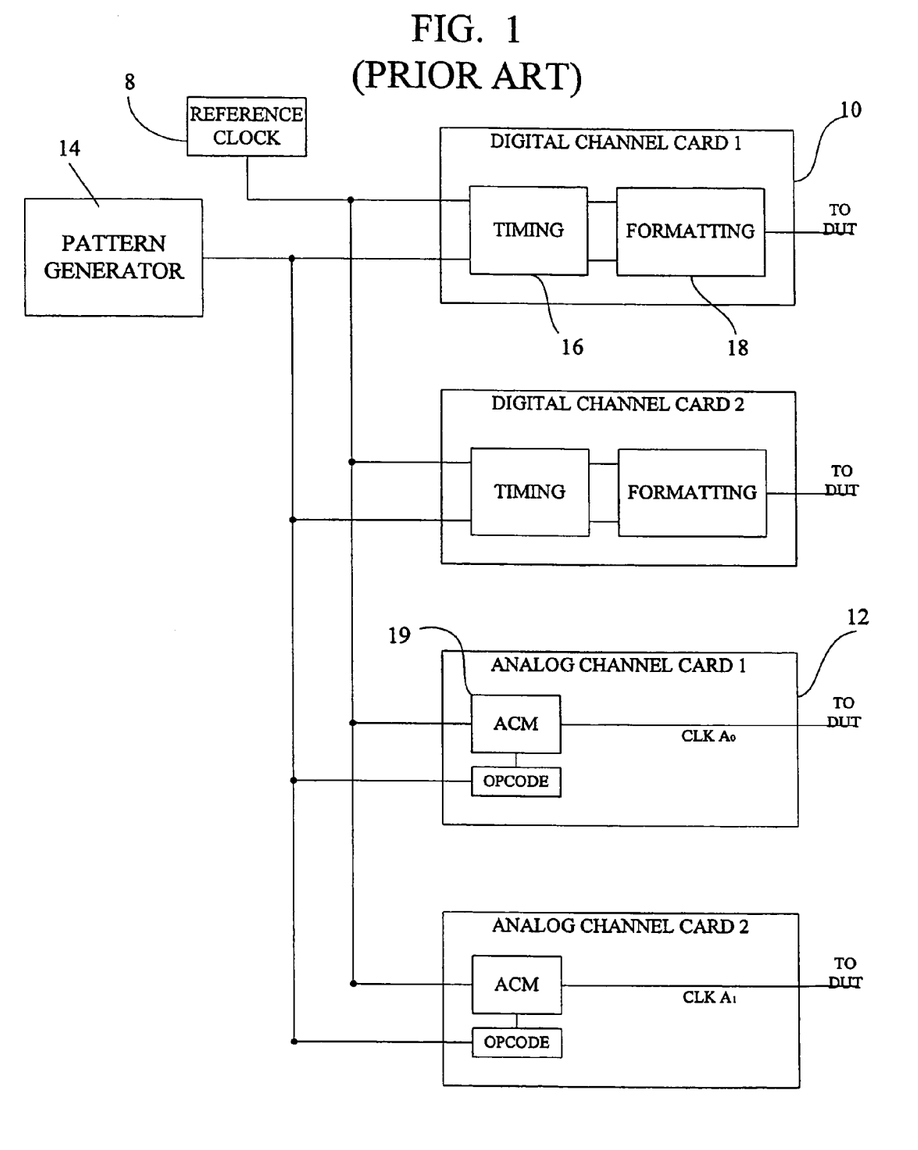
FIG. 1 is a block diagram of a conventional clock architecture for a semiconductor tester.

Signals generated by a centralized pattern generator 14 are fanned out with the reference clock to the channel cards. Pattern generator 14 issues commands that are to be performed by each instrument. A command may be generated for each instrument for each cycle of the reference clock.

Clock signals for the digital cards are fed to timing circuitry 16, which drives waveform formatting circuitry 18 to produce digital signals for application to the device-under-test (DUT, not shown). The analog cards 12, on the other hand, receive the remotely generated digital reference clock signal and synthesize an analog clock through analog clock module (ACM) 19. The local analog clock AO drives functional circuitry on one or more analog instruments.

One form of the analog clock is described in U.S. Pat. No. 6,188,253, entitled Analog Clock Module, assigned to the assignee of the present invention, and expressly incorporated herein by reference in its entirety. Each analog instrument may have its own clock and therefore operate at its own frequency, which could be higher than the frequency of the reference clock.

In a variation of the design shown in FIG. 1, each instrument includes a pattern generator. The pattern generators operate synchronously, based on the reference clock signal. Each pattern generator outputs commands or "events" for its specific instrument at the required time.

A further variation is for each instrument to include a local clock generator to drive its own pattern generator. The local clock generator may produce clocks of different frequencies. However, it is necessary that the pattern generators start in a coordinated fashion.

Published patent application WO/03042710 entitled "CLOCK ARCHITECTURE FOR A FREQUENCY BASED TESTER" (which is hereby incorporated by reference in its entirety) describes a system for coordinating the operation of pattern generators operating at different frequencies. The approach in that published application employs a synchronization signal, called DSYNC, in connection with a reference clock to "align" all of the local clocks at a specific time.

A need exists in the art for a test system in which operation of multiple instruments is readily synchronized.

SUMMARY OF INVENTION

In one aspect, the invention relates to an instrument for an automatic test system in which a communication link carries messages. The instrument has an interface comprising a reference clock input and a port to connect to the communication link. The instrument also includes a clock generator, the clock generator coupled to and adapted to receive a local clock from the reference clock input and outputting a local clock; a timing circuit, clocked by the local clock, having an input to receive a value representative of a time and an output, the timing circuit asserting the output at a time represented by the value received at the input; and a message processing circuit having an input coupled to the port and an output coupled to the input of the timing circuit.

In another aspect, the invention relates to an integrated circuit comprising an interface adapted for use in an instrument for automatic test equipment having functional circuitry that executes a function in response to a command. The integrated circuit includes a reference clock input; a communication link input; a command output; a clock generator, the clock generator receiving the reference clock input and outputting a local clock; a timing circuit, clocked by the local clock, having an input to receive a value representative of a time and an output coupled to the command output, the timing circuit asserting the output at a time represented by a value applied to the input; and a message processing circuit having an input coupled to the communication link input and an output coupled to the input of the timing circuit.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 2:
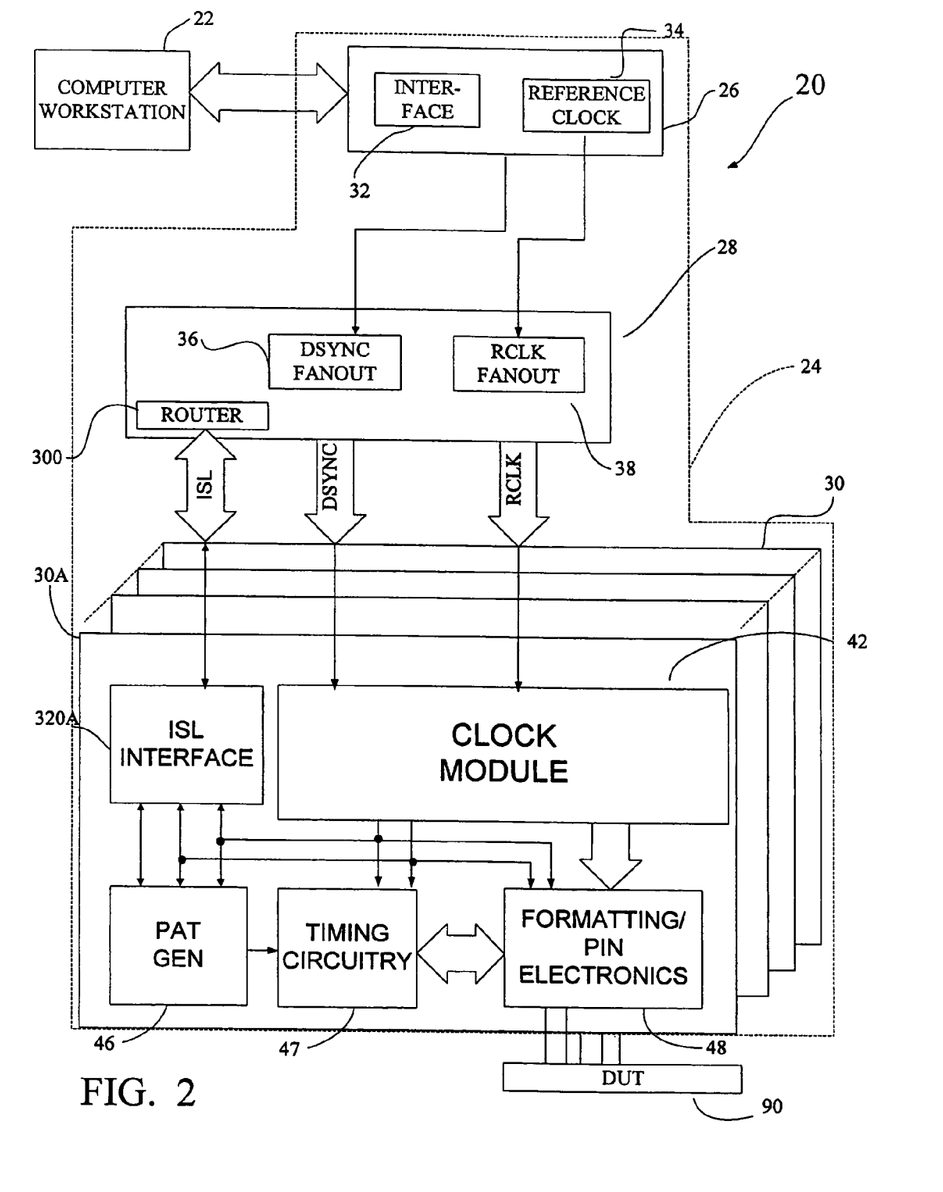
FIG. 2 is a block diagram of a clock architecture according to one form of the present invention.

Referring more specifically to FIG. 2, an embodiment of the invention is described in relation to a semiconductor tester, generally designated 20, that includes a computer workstation 22, and a testhead 24 (in phantom). The testhead houses a plurality of electronic board assemblies for generating and measuring test signals, including central card 26, distribution card 28, and multiple instrument cards 30.

As illustrated in FIG. 2, the central card 26 feeds signals to distribution card 28 for distribution to an array of instrument cards 30. The central card 26 includes a computer interface 32 that ties the workstation 22 to the testhead board assemblies, and a reference clock generator 34 that generates a reference clock, denoted RCLK. The reference clock generator may comprise, for example, a 100 MHz crystal oscillator. Computer interface 32 allows the tester to be interfaced to a computer work station 22, through which a user may develop test programs that can be loaded into tester 20. Computer work station 22 provides a user with other capabilities, such as initiating execution of previously developed test programs or analyzing test results.

The central card 26 includes control circuitry that generates control signals responsive to commands from the workstation. One of the control signals comprises a "DSYNC" signal. The reference clock signal and the DSYNC signal are fanned-out, or distributed, along DSYNC and RCLK fan-out circuitry 36 and 38, respectively, disposed on the distribution of card 28. Distribution of these signals allows pattern generators on multiple instruments to be started in unison as in the above referenced application WO/03042710.

The instruments on instrument cards 30 may be digital or analog instruments or may perform functions involving digital and analog signals. Instrument 30A depicts a digital instrument, also called a "channel card." A channel card may contain electronic resources for multiple tester channels. A test system is likely to include multiple channel cards.

Further referring to FIG. 2, each channel card 30A includes a clock module 42. Clock module 42 may be programmed to generate one or more clocks of a desired frequency from RCLK. In the described embodiment, each of the clocks generated by a clock module 42 is intended to be used "locally," i.e. within the instrument or board containing the clock generator. A clock generator may generate clocks of several different frequencies. Because all of the clocks are generated from the same source, the clocks may be considered synchronous with each other. The clock module may be similar in construction to the analog clock module described in U.S. Pat. No. 6,188,253, previously incorporated by reference herein.

The local clocks may be derived through direct digital synthesis using a phase locked loop driven by a numeric counter oscillator (NCO) as described in currently pending U.S. patent application Ser. No. 10/748,488, entitled MULTI-STAGE NUMERIC COUNTER OSCILLATOR, filed Dec. 29, 2003, which is hereby incorporated by reference in its entirety. That application describes a numeric counter oscillator that may be used in a direct digital synthesis circuit to derive one or more local clocks of a programmable frequency from the reference clock.

Each instrument card includes circuitry to perform the desired function of the instrument. In the case of a digital instrument such as 30A, the functional circuitry includes timing circuitry 47, and formatting/pin electronics circuitry 48. This circuitry can generate and measure digital signals for testing DUT 90.

In addition, digital instrument 30A includes a pattern generator 46. Pattern generator 46 provides a sequence of commands that control the functional portions of instrument 30A. Pattern generator 46 may provide branching in response to certain conditions or execute other conditional functions based on a status of the test system. Pattern generator 46 is clocked by a clock from local clock module 40 and may therefore provide instructions at a programmable rate, which may be higher than the frequency of the reference clock.

In addition, instrument 30A includes an instrument synchronization link (ISL) interface 320A as will be described in greater detail below. ISL interface 320A allows pattern generator 46 to communicate with other instruments. Pattern generator 46 may send commands to be executed by the functional circuitry of other instruments or receive status information from other instruments that may, for example, be used to control conditional branching.

Other instruments may have different functional circuitry, depending on the specific function to be implemented by the instrument. In the described embodiment, each instrument card includes a clock module 42.

Each instrument in the described embodiment also includes an interface to the ISL. Some instruments may be a source of messages transmitted through the ISL. Others may be a destination for messages transmitted through the ISL. Instruments may be constructed with ISL interfaces that transmit only or that receive only or that both transmit and receive messages through the ISL. Alternatively, it may be desirable to construct a single integrated circuit that performs all ISL functions and use that integrated circuit on all instruments that require any of the ISL functions. For instruments that do not use any ISL functions, the ISL interface may be omitted entirely.

Some instruments may contain a pattern generator having the same form as pattern generator 46. In one embodiment, each pattern generator is programmed with the specific commands that instrument needs to execute during a test. However, not all instruments contain pattern generators. The instruments that do not contain pattern generators may receive commands over the ISL based on the programs stored in pattern generators of other instruments. Accordingly, each pattern generator may be programmed with commands for multiple instruments in the system to execute.

In one embodiment, digital instruments contain pattern generators and analog instruments do not. Such a division is desirable because it allows the pattern generators for digital instruments to be redesigned each time a digital instrument operating at a higher speed is designed without requiring changes on analog instruments. However, such a partitioning of the design is not required.

More generally, some instruments will act as controllers that send commands to other instruments. Other instruments will act as controlled instruments that receive commands from other sources. Generally, controlled instruments will not have pattern generators or will not have pattern generators operating at the same rate as those in the digital instruments.

Figure 3:
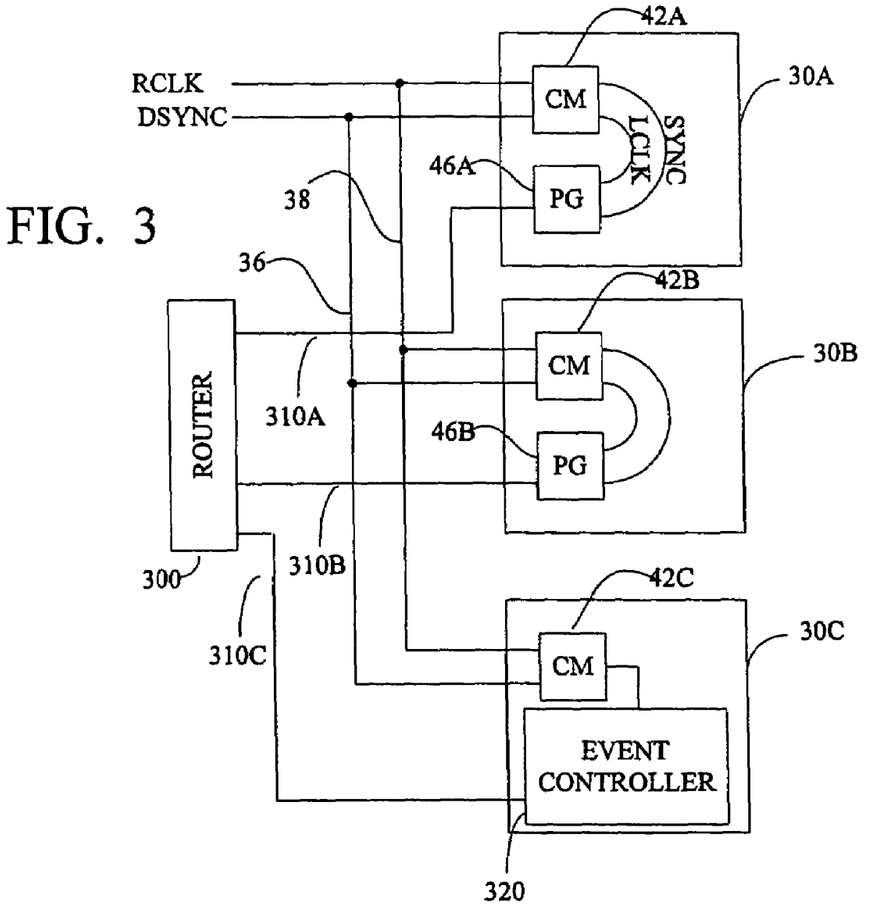
FIG. 3 is a simplified block diagram of the clock architecture of FIG. 2.

Coordinated operation of all instruments is often desired. Local clocks in multiple instruments may be synchronized as described in the above mentioned patent application WO/03042710. As shown in FIG. 3, a reference clock, RCLK and a synchronization signal DSYNC, are distributed to multiple instruments, such as 30A, 30B and 30C. The DSYNC signal identifies a particular edge in the RCLK signal which is taken as a reference time by each instrument. Once the local clocks are aligned to a common time reference, each instrument may have a "watch" that tracks time by counting pulses of a local clock.

Events within the tester occurring on different instruments may be coordinated by reference to time as tracked by the local watches. For example, a first instrument may send a command to a second instrument. The time of execution of that command may be specified relative to the local watch of the first instrument. If the local watch on the second instrument is synchronized to the local watch on the first instrument, event controller circuitry 320 on the second instrument can initiate execution of the command at the appropriate time by monitoring the local watch on the second instrument. The appropriate time can be ascertained even if the instruments contain clock modules generating local clocks of different frequencies.

By establishing a common time reference, the signals that convey the commands or other messages need not be transmitted synchronously. A relatively low cost and simple asynchronous communication link may be employed that relies on time values in messages—rather than arrival times of certain signals—to control timing of events.

FIG. 3 shows that the instrument synchronization link (ISL) shown in FIG. 2 is formed by a communications network. Here, that network has lines, such as 310A, 310B and 310C, connected to each of the instruments such as 30A, 30B and 30C. Connections to the network may be made in any suitable manner. For example, each ISL interface may have a port or other connection point. A port may be formed physically by a connector attached to the instrument such that lines carrying signals on the ISL may be readily coupled to the instrument. In the case where ISL lines are physically implemented as traces in a backplane or other printed circuit board in the tester, the port could be implemented as a backplane connector. Where the lines of the ISL are implemented as discrete cables, the port may be implemented as a discrete connector, such as an RJ-45 receptacle. Communication between instruments is facilitated by router 300 that passes signals from a line connected to an instrument acting as a source of a message to the lines connected to the instruments intended to be the destination of the message.

Various implementations of communication lines and routers are known. Because synchronization need not be provided by the characteristics of the transmission media, the specific implementation of the communication line and the router is not critical to the invention. For example, each of the communication lines 310A . . . 310C may be a high speed serial line, such as is sometimes called a SerDes line. Firewire and USB2 are examples of standard SerDes communication protocols. Communication over lines 310A . . . 310C could use such a standard protocol. But, a protocol requiring fewer overhead bits is used in the described embodiment to provide lower latency for message transmissions.

Here, the communication lines operate in excess of 1 Gbps and messages are packet based. Each packet may include various fields to facilitate communication. For example, a packet may include a header with a source and destination ID. Each instrument may have its own ID value that could be used to specify the source and the destination of a particular message.

A packet may also include a field for a command value. The command value may specify the action for the instrument identified in the destination field to perform. In one embodiment, each instrument has a microcode store that contains multiple microcode sequences corresponding to various operations the instrument may perform. The command specifies a particular microcode sequence. The instrument executes a command by executing the specified microcode sequence from the store.

A command field may also signal a status to another instrument. For example, an instrument may place a value in the command field indicating that it detected a failure or that it completed a measurement. The instrument receiving this command value may then respond appropriately, such as by transferring the results of the measurement to a processor or altering execution of a test pattern to reflect the failure.

In the illustrated embodiment, packets also include a time value, sometimes called a "time stamp." When the command field indicates an event to be executed, the time stamp indicates the time at which this event should happen. When the command field indicates a status, the time stamp may indicate the time at which a conditional operation, such as a branch to be taken in response to that status, should be performed. As described above, the local watches in all the instruments are synchronized so that each instrument can communicate time values relative to the same DSYNC event.

Packets may include further fields. For example, a checksum field or other fields may be added for error detection or error correction. Multiple messages, each communicating a command or status event, may be included in one packet. Each such message could have its own time stamp.

In the illustrated embodiment, the ISL includes a router 300. Router 300 may be implemented to operate according to any convenient algorithm. For example, router 300 may receive each inbound message and transmit an outbound message on a specific line based on the destination value in the packet header.

In the embodiment of FIG. 3, instruments 30A and 30B are illustrated as digital channel cards. Each includes a pattern generator, 46A and 46B respectively. Instrument 30C represents an analog instrument. Analog instrument 30C as illustrated in FIG. 3 does not include a separate pattern generator. Analog instrument 30C includes an event controller connected to local clock module 42C, which contains sufficient circuitry to receive and respond to commands and/or send status messages. The event controller 320 is described in greater detail in connection with FIG. 5, below.

The pattern generators in the digital instruments contain programs that specify the sequence of operations to be performed during testing of a device. In the illustrated embodiment, these programs specify operations to be performed by both analog and digital instruments. They may specify, for example, that a certain analog source is to generate a sine wave of a desired frequency at a certain time relative to an event in a digital channel or that a receiver is to start capturing the output of a DUT at a particular time relative to an event in the digital channel.

Figure 4A:
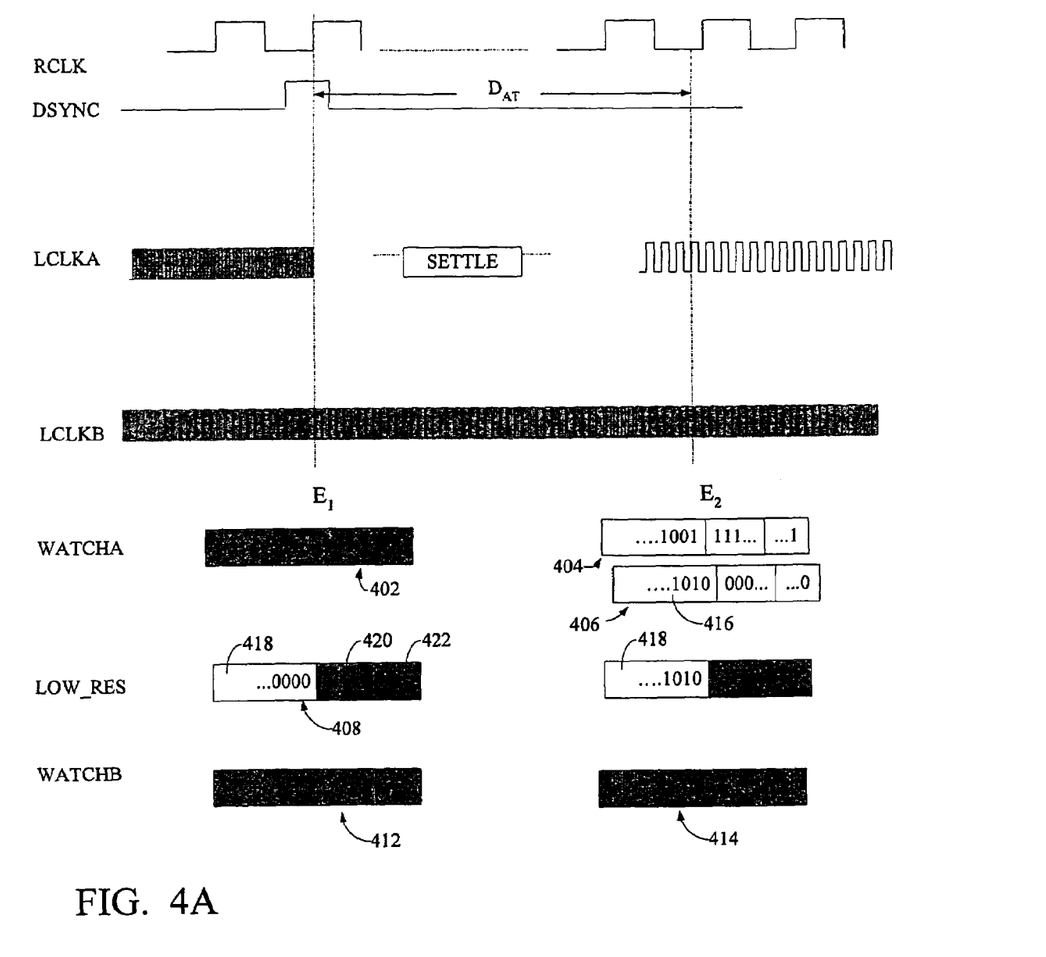
FIG. 4A is a timing diagram illustrating alignment of a local clock.
Figure 4B:
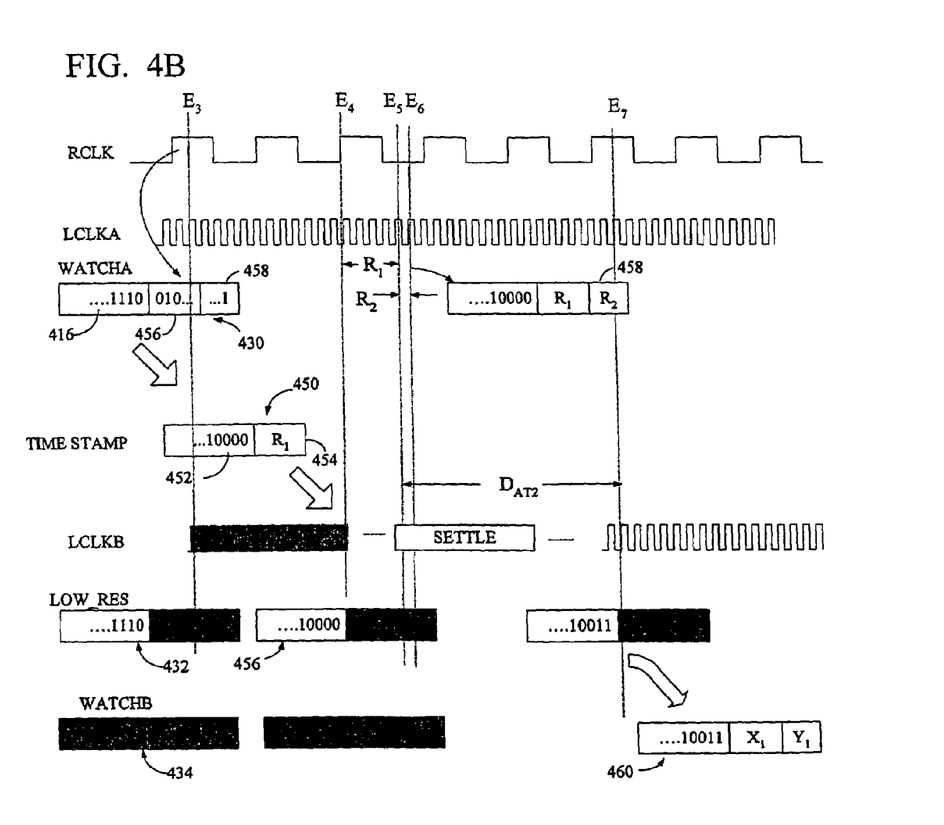
FIG. 4B is a diagram illustrating synchronization of watches.

FIGS. 4A and 4B illustrate the process by which local watches in two instruments are synchronized. As described above, each instrument may include a clock module to generate one or more local clocks. In the described embodiment, each clock module receives a reference clock, RCLK, and a synchronization signal, DSYNC.

FIG. 4A illustrates that the DSYNC signal identifyes a specific edge of the reference clock signal at time $E_1$. Preferably, the RCLK and DSYNC signals will be distributed to each of the clock modules such that the clock module in each of the instruments can identify time $E_1$ as a reference time.

FIG. 4A also illustrates the signal LCLKA. LCLKA represents a local clock generated by a clock module. LCLKA is shown to have a shorter period than RCLK. Accordingly, counting pulses of LCLKA allows a watch to track time with relatively high resolution.

LCLKA is aligned with the reference clock. As described in the above referenced patents and patent application, it is known to align a local clock signal with the reference clock signal on the occurrence of the DSYNC signal. In the example used herein, LCLKA is generated with a DDS circuit that includes an NCO. At time $E_1$, the NCO is set to a predetermined value to establish a phase for LCLKA relative RCLK. Prior to time $E_1$, LCLKA may not be aligned with RCLK, meaning that there is no deterministic relationship between the edges of LCLKA and RCLK or that the relationship is not known. However, some settling time after $E_1$, the signal LCLKA becomes aligned with RCLK. As shown, LCLKA has a different period than RCLK. Thus, alignment of clocks does not require that all edges be coincident. Rather, as used herein, the term implies that there is a relationship between edges that is repeatable each time a test program is executed.

After this settling interval an edge of the signal LCLKA is used to set the local watch. Here, that edge is illustrated at time $E_2$. The time $E_2$ occurs a delay, DAT, after the time $E_1$. In the described embodiment, the clock module generates local clocks using phase locked loop circuitry. After any change in the input or settings of the phase locked loop, the output of the phase locked loop may contain jitter or otherwise not be predictable. The delay, $D_{AT}$, allows the phase locked looped to settle to a predictable value.

The delay $D_{AT}$ can be determined because the clock generation circuit includes an NCO portion, which is implemented with digital circuitry and therefore has a deterministic output even during the settling interval. Therefore, the interval $D_{AT}$ can be measured by counting cycles of the NCO, even though the output of the phase locked loop is not stable during that interval. The specific number of cycles in the settling interval will depend on the specific design of the clock module.

In the illustrated embodiment, the accumulator within the NCO is reset to zero at time $E_1$ and cycles through the NCO are counted until a sufficient interval has passed that the output of the phase locked loop will be stable. At the end of the settling interval, the local watch is loaded with a value equal to the settling interval DAT. In this way, the watch tracks time with the time $E_1$ identified by the DSYNC signal acting as the zero time reference.

In the embodiment described herein, the process of FIG. 4A is used to set a watch in each instrument that may act as a controller instrument. WATCHA represents the watch in a controller instrument. At time $E_1$, WATCHA has a value 402. The value 402 is indeterminate because WATCHA has not been set at that time. FIG. 4A shows that at time $E_2$, WATCHA is loaded with the value 404, representing the delay, $D_{AT}$. Thereafter, WATCHA increments for each pulse of LCLKA, with the amount of each increment reflecting the length of a period of LCLKA. For example, value 406 shows WATCHA one pulse of LCLKA after value 404.

Controlled instruments may also include local clocks that clock watches on those instruments. However, for those watches to be useful in identifying times, they must be synchronized to the watch in the controller instrument. FIG. 4A shows a local clock LCLKB in a controlled instrument LCLKB. It may be, but need not be, of the same frequency as LCLKA. For the most accurate and repeatable tracking of time within the test system, it is preferable the LCLKB be aligned with LCLKA. Also, a WATCHB on the controlled instrument should be loaded with a time value that corresponds with the value in a WATCHA on the controller instrument.

FIG. 4A shows that the values 412 and 414 in WACTHB at times $E_1$ and $E_2$ are indeterminate, because they have not been synchronized to WATCHA. Also, FIG. 4A shows that local clocks LCLKA and LCLKB may not be aligned, meaning that there is not necessarily a known relationship between the edges of LCLKA and LCLKB.

Despite the fact that WATCHB initially has indeterminate values, a controlled instrument may track time using a LOW_RES watch. The LOW_RES watch has a lower resolution than WATCHA in the controller instrument. However, the LOW_RES watch can be readily synchronized to WATCHA and used to synchronize WATCHA to WATCHB. FIG. 4A identifies this low resolution watch as LOW_RES. At time $E_1$ LOW_RES watch takes on a value 408. Time $E_1$ is taken as the reference point for WATCHA. Accordingly, LOW_RES watch is given a value of zero at time $E_1$. A controlled instrument may readily identify the time $E_1$ in the described embodiments because all instruments receive the RCLK and DSYNC signals.

LOW_RES watch increments one count for each cycle of RCLK. In the illustrated embodiment, LOW_RES watch contains a field 418 that tracks time with the same resolution as field 416, representing the most significant bits of WATCHA. Accordingly, FIG. 4A shows that after WATCHA is set at time $E_2$, the value in field 418 approximates the value in field 416 of WATCHA. Differences may be attributed to rounding linked to the fact that WATCHA represents time with greater resolution than LOW_RES watch and that LCLK and RCLK edges occur at different times.

In FIG. 4A, LOW_RES watch is shown with fields 420 and 422 having indeterminate values. These fields represent the least significant fields of LOW_RES and represent more bits of resolution than LOW_RES watch can produce. Accordingly, their values are not shown and they can be assumed to be zero to allow a ready comparison between the values in WATCHA and LOW_RES watch. Fields 420 and 422 need not be included in an implementation of LOW_RES watch.

FIG. 4B illustrates the process by which a controller instrument may synchronize its local watch, here designated WATCHA, with a local watch on a controlled instrument, here designated WATCHB. The process involves the controller instrument sending a command to the controlled instrument indicating that WATCHB should be synchronized with WATCHA. The command includes a time stamp 450, which identifies the time at which the synchronization should occur as well as the synchronization value.

At some time, denoted $E_3$ in FIG. 4B, the controller instrument computes a time stamp 450 that is sent to the controlled instrument in a command. At time $E_3$, WATCHA is shown to have the value 430. At time $E_3$, the value 434 in WATCHB is still indeterminate. The LOW_RES watch on the controlled instrument has a value 432. The value 432 approximates the value 430 to the limits of resolution of LOW_RES watch.

The value in WATCHA at time $E_3$ is used to compute a time stamp 450. Time stamp 450 is computed by adding some offset to the value in WATCHA at the time the time stamp 450 is computed. The amount of the offset is preferably sufficiently long to allow a message containing the time stamp to be transmitted from the controller instrument to the controlled instrument. In this way, the time stamp 450 will represent a time that occurs after the controlled instrument receives the synchronization command.

In the embodiment illustrated in FIG. 4B, the time stamp 450 includes fields 452 and 454. WATCHA includes fields 416 and 456 that have the same number of bits as fields 452 and 454, respectively. WATCHA includes additional bits in field 458. The additional bits in field 458 represent additional resolution with which WATCHA tracks time, but bits with that resolution are, in the pictured embodiment, truncated in computing the value of time stamp 450.

The value in time stamp 450 may be used to identify the time at which the resynchronize watches command should be executed. The most significant bits of time stamp 450 in field 452 represent time with the same resolution as LOW_RES watch. At some time, denoted $E_4$ in FIG. 4B, LOW_RES watch takes on a value 456 matching the bits in field 452 of time stamp 450. By comparing the value in LOW_RES watch to the value in field 452 of time stamp 450, a controlled instrument may identify the time $E_4$.

The value represented by time stamp 450 occurs a time $R_1$ after time $E_4$. This time is represented in FIG. 4B as $E_5$. To generate a local clock with a reference edge at time $E_5$, the local clock must be aligned at time $E_4$ with a value that will create the same effect as aligning an edge of the local clock at time $E_5$. LCLKB is aligned at time $E_4$ by setting the value in the NCO of the DDS circuit used to generate LCLKB to a value based on $R_1$. Conceptually, an interval R1 after time E4 (e.g., time E5), the NCO should be at "zero," indicating an edge of LCLKB should occur. Even though LCLKB is not available at time E4 of E5, the values in the timing circuitry of the controlled instrument are set so that when the circuitry settles and LCLKB is generated, LCLKB will have a phase as if it had an edge at time E5.

Some settling interval is then required. The settling interval is illustrated in FIG. 4B as $D_{AT2}$.

The end of the settling interval is illustrated at time $E_6$. At time $E_6$, WATCHB is loaded with an initial value and clocked with LCLKB. WATCHB is loaded with a time that represents the value of time stamp 450 in the synchronization command plus the delay $D_{AT2}$. In this way, WATCHB is loaded with a value having a deterministic relationship to the value in WATCHA and is thereafter clocked by LCLKB, which has a repeatable relationship to the local clock that clocks WATCHA. In this way, WATCHB is synchronized to WATCHA.

In the example of FIG. 4B, a possible source of variation results from truncation of the value used to create time startup 450. As described above, an amount $R_2$ is truncated from the time stamp before it is transmitted. Thus, when WATCHB is synchronized to WATCHA, WATCHB is loaded with a value that is smaller than the value in WATCHA by an amount R2. The value of $R_2$ may vary each time a test program is repeated. Precision with which commands can be repeatedly executed can be increased by storing the remainder $R_2$ and using it to adjust any time stamp values in commands from a controller instrument to a controlled instrument in which the watches are synchronized according to the process shown in FIG. 4B.

Figure 5:
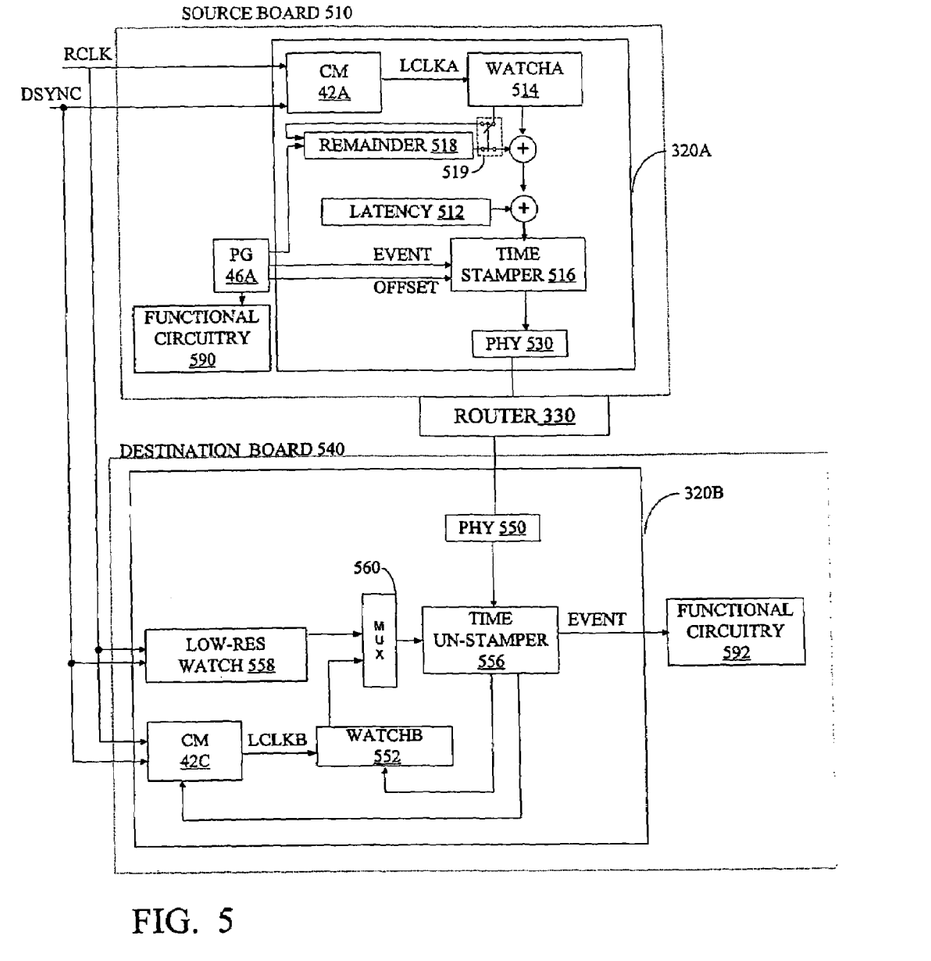
FIG. 5 is a block diagram of circuitry interfacing two instruments.

Turning now to FIG. 5, a block diagram of an interface circuit that can be used to communicate commands between a source board 510 and a destination board 540 is shown. Source board 510 includes functional circuitry 590 and destination board 540 includes functional circuitry 592. In the embodiment where source and destination boards 510 and 540 are instruments, the functional circuitry executes the functions required for the instrument and may be circuitry as now known in the art or as later developed to perform functions used to test semiconductor devices. For example, source board 510 may be a digital instrument 30A and destination board 540 may be an analog instrument 30C and each may contain functional circuitry appropriate for generating and measuring digital or analog signals, respectively.

Here, source board 510 is shown to have pattern generator 46A that generates commands to control the functional circuitry 590. Destination board 540 is shown without a pattern generator. Pattern generator 46A generates commands for destination board 540. Those commands are communicated to destination board 540 over the ISL.

A communication path between the boards is provided through router 330, which is part of the ISL. Source board 510 includes an interface circuit 320A to facilitate communication over the ISL. Destination board 540 includes an interface circuit 320B. Each interface circuit 320A and 320B may be implemented as one or more ASICs or other integrated circuit chips.

Interface 320A includes PHY 530 and interface 320B includes PHY 550. PHY 530 and PHY 550 are the circuitry needed to manage communication according to the selected protocol of the ISL. This circuitry performs functions traditionally performed in the hardware components of a network interface, such as forming messages into packets, checking parity, driving and receiving data over the physical network connection, retransmitting packets upon an error and passing valid packets received to the next higher level of the network for processing. PHY 530 and 550 can also verify that messages comply with the format of the selected protocol. For example, they may check that source or destination ID's correspond to valid source and destination ID's in the tester. Or, they may check that the value in the time stamp field of a message represents a valid future time.

Transmission of a packet in this example is initiated by pattern generator 46A indicating an "event" is to happen. The event indicates that the instrument on destination board 540 is to perform a command. In addition to specifying the event to occur, pattern generator 46A indicates a time when the event is to occur. In the illustrated embodiment, the time of the event is an offset from the current time.

The offset is provided to a time stamper circuit 516. Time stamper circuit 516 computes a time stamp indicating the time at which destination board 540 is to execute the command and passes this time stamp, along with the indication of the event, to PHY 530 for transmission. The current time for interface 320A is kept in WATCHA 514.

The "watch" may be implemented in any convenient way, but preferably includes a circuit that records passage of time based on a clock signal. Preferably, the watch is clocked by a clock that is synchronous with the clock that drives pattern generator 46A. The watch may be implemented simply as a counter with a small amount of control circuitry to reset and load the counter to perform the functions described herein. In the illustrated embodiment, WATCHA 514 is clocked by local clock LCLKA generated by a local clock module 42A. The number of bits of resolution with which each watch tracks time is not critical to the invention. Each watch preferably has a number of bits that allows it to track time with a resolution equal to or smaller than the period of the clock driving that watch. Preferably, all clocks will have at least as many bits of resolution as the time stamps in messages passed from instrument to instrument. However, individual instruments may track time with greater or lesser precision.

Destination board 540 includes a WATCHB 552. WATCHB 552 keeps time relative to local clock LCLKB. It is not necessary that LCLKA and LCLKB be clocks of the same frequency. Rather, it is sufficient that WATCHA 514 and WATCHB 552 either output time in the same format or that the time values in the format generated by WATCHA 514 and WATCHB 552 be converted to some common time format before time stamps generated relative to one watch are compared to the time kept by a different watch. Here, WATCHA and WATCHB are synchronized according to the process illustrated in FIGS. 4A and 4B.

In the illustrated embodiment, the value stored WATCHA 514 is augmented by the remainder value $R_2$ stored at the last synchronization of watches. This value is stored in a register 518. As described above in connection with FIG. 4B, the remainder $R_2$ represents a difference between the time tracked in WATCHA and the time tracked in WATCHB that is introduced by truncating the value used to create a time stamp for the synchronize watches command. By adding this remainder value to the time used to create the time stamp for all commands after the synchronize watches command, the truncation has no effect on the time at which destination board 540 responds to a command.

FIG. 5 shows a ganged switch 519 at the input and output of remainder register 518. Switch 519 represents that in some cycles the remainder value $R_2$ is derived from a value in WATCHA 514. In the cycles when $R_2$ is being stored the value in register 518 is not used to adjust the time in WATCHA 514. Here, switch 519 represents any circuitry that performs the desired function.

In computing the time stamp, the value in WATCHA is also augmented by a latency value stored in register 512. The latency value is selected to be longer than the maximum transmission delay for a message from source board 510 to any other destination board 540. Preferably, the latency value is fixed. Test systems are generally calibrated for fixed delays between instruments. Accordingly introduction of a fixed delay does not introduce any errors in timing, but helps ensure that the destination board does not receive a message specifying execution of a command at a time that passed while the message was being transmitted over the ISL.

When a packet is sent by source board 510 to destination board 540, the packet passes through PHY 550. As above, PHY 550 is hardware dedicated to managing network functions. When PHY 550 receives a valid packet, the contents of the packet are communicated to higher level circuitry. As illustrated, a packet containing a message indicating an event to be executed is passed to time un-stamper 556.

Time un-stamper 556 outputs control signals to the rest of the circuitry on destination board 540 when an event specified in a command is to be executed. A line carrying a control signal that causes functional circuitry 592 to execute an event is pictured. It should be appreciated that destination board 540 may respond to many types of commands requiring control signals to be sent to other circuitry on destination board 540. For example, it is described above that a controlled instrument may receive a synchronize watches commands. Such a command triggers alignment of clocks within clock module 42C and loading values into WATCHB. Therefore, control signals may also run from time un-stamper 556 to clock module 42C and WATCH B 552. Lines carrying other control signals may be present, but are not shown for clarity.

Multiplexer 560 is controlled to provide a value to time un-stamper based on the synchronization process in FIG. 4B. Time un-stamper 556 monitors the time input to identify when the time specified in a time stamp is reached. At this time, time un-stamper 556 asserts the appropriate control signals.

Time un-stamper 556 receives a current time value through multiplexer 560. Multiplexer 560 is steered based on the command to be executed. For a synchronize watches command, time values are derived from LOW_RES watch 558. For all other commands, time values may be provided from WATCHB 552. Multiplexer 560 represents any circuit that provides the value of to LOW_RES watch 448 to time un-stamper 556 before WATCHB is synchronized and provides the value in WATCHB 552 after it is synchronized.

Low resolution watch 558 counts pulses of RCLK and is reset upon assertion of the DSYNC signal as described in FIG. 4A. Low resolution watch 558 may be a separate hardware element from local watch 552. Alternatively, low resolution watch 550 may be a logical construct implemented by using only the high order bits of local watch 552.

When a packet transmitted over the ISL specifies an event to be performed by functional circuitry 592, time un-stamper 556 outputs the command portion of that packet to the functional circuitry 592 in the instrument at the time specified in the time stamp. The instrument may process the command output by time un-stamper 556 in the same way that prior art instruments responded to commands output by pattern generators. In one embodiment, the event signal indexes a microcode memory based on the command value and starts a sequencer that successively retrieves and executes microcode instructions from the memory.

Various implementations of time un-stamper 556 are possible. Time un-stamper 556 may contain a single unit with a register to store the time stamp from a message and to temporarily store the command value. The unit may include a digital comparator that compares the time stamp to the appropriately offset value from the local watch. Control circuitry may monitor the output of the comparator and pass the command value to the output when the time values match. Other interface circuitry may be included to signal the rest of the circuitry in the instrument to execute the command.

However, more complex implementations are possible. For example, the time un-stamper may include multiple units so that multiple commands may be scheduled for the instrument. Time un-stamper would then output each command to be executed at the time indicated by its corresponding time stamp. Multiple time un-stamper units may also allow commands to be processed in an order other than the order received.

Figure 6:
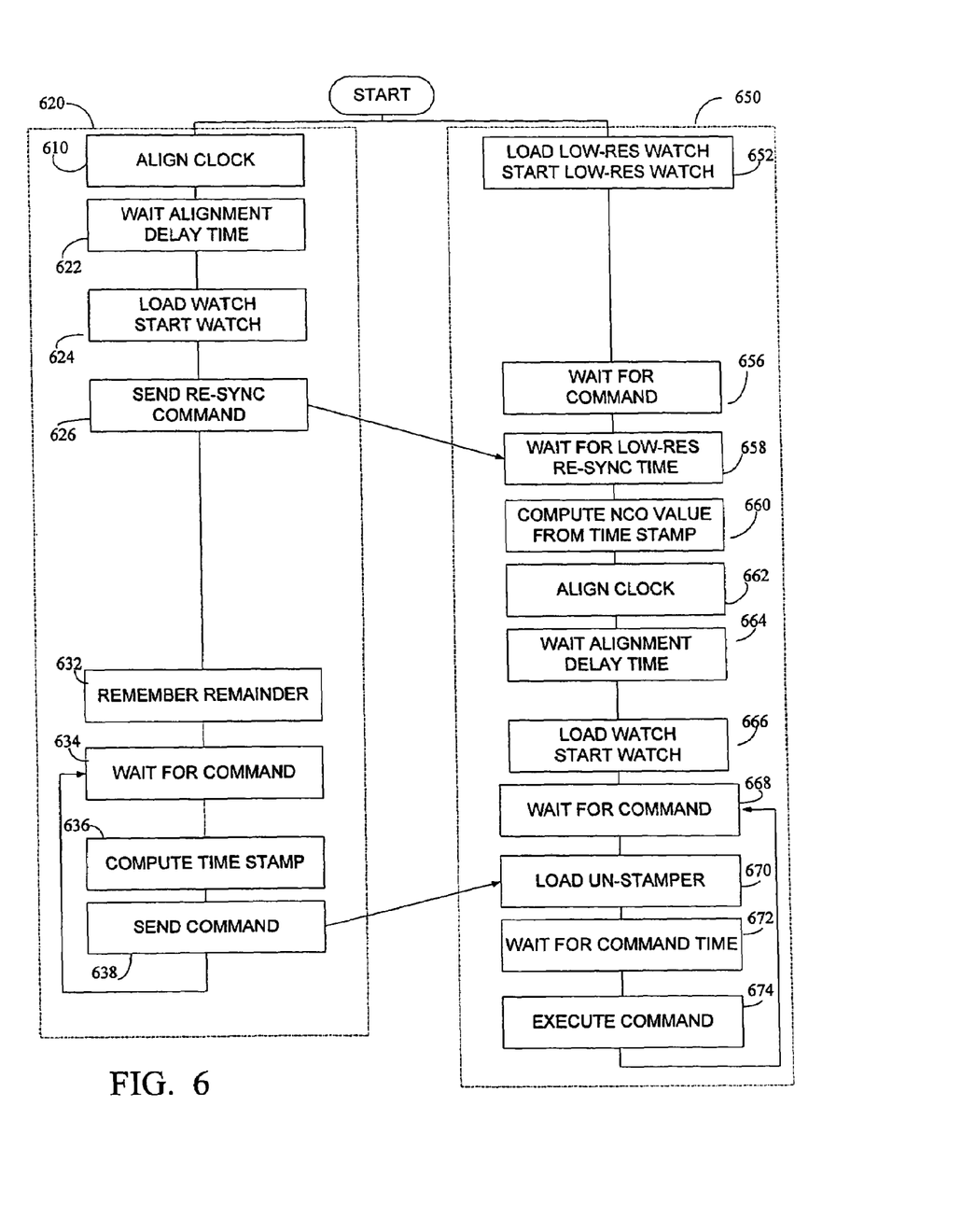
FIG. 6 is a flow chart illustrating a communication process between two instruments.

FIG. 6 is a flow chart illustrating the process by which a system, such as an automatic test system as shown in FIG. 2 or 3, may operate.

The process includes two parallel sub-processes shown as sub-process 620 and sub-process 650. In the example of FIG. 6, sub-process 620 is executed in the ISL interface 320A (FIG. 5) of a controller instrument. Sub-process 650 is implemented in the ISL interface 320B (FIG. 5) of a controlled instrument.

At step 610, a local clock within the controller instrument is aligned with RCLK. A process as illustrated above in connection with FIG. 4A may be performed to align the clock. Within the controlled instrument, step 652 may be performed at the same time. At step 652, a LOW_RES watch is reset and controlled to begin counting pulses of RCLK.

The controlled instrument then waits at step 656 to receive a command over the ISL. At step 622, the controller instrument waits for the alignment delay time as illustrated in FIG. 4A.

At step 624, a watch within the controller instrument is loaded with the alignment delay time and that watch starts running.

At step 626, the controller instrument sends a "synchronize watches" command to the controlled instrument over the ISL. This command may be sent in response to a command programmed in a pattern generator on the controller instrument. The synchronization command includes a time stamp as indicated at 416 in FIG. 4B.

At step 658, the controlled instrument receives the command over the ISL and waits until the low resolution watch indicates a time that matches the most significant bits of the time stamp in the synchronize watches command.

At step 660, the value to be loaded into the NCO used to generate LCLKB is computed. The value is computed such that, if the value is loaded into the NCO at time $E_4$, LCLKB, when finally generated, has a phase, as if it had an edge at time $E_5$. As illustrated by FIG. 4B, this value depends on the value of $R_1$. It also depends on the frequency of the clock used to clock that NCO and may depend on other factors relating to the design of the clock generation circuit.

At the alignment time indicated by the LOW-RES watch, the controlled instrument aligns its local clock at step 662. Alignment of the clock at step 662 is performed by loading the computed value into the NCO.

At step 664 the controlled instrument waits an alignment delay time, such as is indicated by $D_{AT2}$ in FIG. 4B. After the alignment delay time, the process continues to step 666. At this step, WATCHB is loaded with a value representing the sum of the time stamp in the resynchronized watches command and the alignment delay time used at step 664. Thereafter, the WATCHB maybe be clocked by the local clock in the controlled instrument.

Subprocess 650 continues at step 668, where the controlled instrument waits for further commands from the controller instrument.

On the controller instrument, the process proceeds from step 626 to step 632. At step 632, the remainder reflecting the truncated portion $R_2$ shown in FIG. 4B is stored. The remainder may be stored, for example, in a register such as 518 (FIG. 5).

Sub-process 620 continues on the controller instrument at step 634. At step 634, the interface circuit waits for a command to send to another instrument. In the embodiment shown in FIG. 5, interface circuit 320A may receive commands from pattern generator 46A. When interface circuit 320A receives a command, the process proceeds to step 636.

At step 636 the interface circuit computes the time stamp to be transmitted along with the command. For an interface circuit shown in the embodiment of FIG. 5, the time stamp is computed by adding to the current time stored in the local watch, the remainder value stored at step 632 and a predetermined latency to an offset that is programmed in the pattern generator.

At step 638, interface circuit 320A forms a packet including the time stamp computed at step 636 and transmits the packet over the ISL.

Interface circuit 320B on the controlled instrument waits at step 668 until a command is received. When the command is received over the ISL, the process continues at step 670. At that step, the time stamp from the packet received over the ISL is loaded into a time un-stamper, such as 556 (FIG. 5).

At step 672, the time un-stamper waits until the time stored in the local watch provided to the time un-stamper has a time value matching the time stamp stored at step 670. When the stored time stamp matches the time on the local watch, the process continues at step 674.

At step 674, time un-stamper 556 asserts control signals for functional circuitry 592 that cause a command specified in the packet sent at step 638 to be executed by functional circuitry 592.

The process may continue in this way with the controller instrument generating additional commands and the controlled instrument responding to those commands. The specific commands executed may depend on the type of functional circuitry within the instruments. The additional commands executed may include the synchronize watches command, which may occur more than once during the operation of the tester.

The described embodiment provides several advantages. The architecture described above enables commands to be asynchronously communicated between instruments, meaning that the time of execution of the command does not depend directly on the time the command is received. Precise synchronization is provided—with less than 10 picoseconds of resolution and preferably less than 1 picosecond of resolution. Yet, the only clock distributed throughout the test system is relatively low frequency. The reference clock is preferably less than 200 MHz and preferably 125 MHz or less. A currently contemplated embodiment has a reference clock of 100 MHz. An accurate, low frequency clock can be generated with less expensive circuitry than a higher frequency clock and is more easily routed throughout the test system.

Further, the architecture shown in FIG. 3 decouples the design for analog instrument 30C from the design of the pattern generators used in the test system 20. Advantageously, an analog instrument developed for a system employing the architecture of FIG. 3 may be used in any test system designed with the same architecture. Such a capability is important where it is necessary to frequently change the design of digital instruments to allow operation at higher clock rates. A significant cost savings is provided to both manufacturers and users of automatic test equipment if instrument designs can be carried forward from one generation of test equipment to the next. Even further advantage is obtained where the interfaces to instruments can be maintained from generation to generation. If the design and interface remains the same, the same physical boards containing the instruments may be directly moved from one test system to another test system.

Further, the use of a third party instruments may be more readily facilitated. The third party instruments could be integrated into a test system with a relatively compact interface that includes the event controller such as is shown in FIG. 5. Such an interface may be constructed on a single integrated circuit chip or a small number of chips or otherwise conveniently packaged as a circuit module. The interface may optionally include a local clock module. A tester manufacturer may provide the interface to third party instrument suppliers who could incorporate them into instruments. Instruments using the defined interface may then be readily incorporated into test systems.

Further, the above architecture allows many other desirable features to be easily implemented. For example, it is not necessary that messages on the communication links between instruments be directed to a single instrument at a time. Broadcast messaging may be implemented by defining a destination ID that could be included in a packet to indicate that all instruments in the system should receive and process the packet. Each instrument may receive and respond to messages with either their own ID or the broadcast ID in the destination field of the message. Preferably, when a group of controlled instruments receives a command, all instruments in the group have watches that have been synchronized to the watch in the instrument sending the command.

Further, a limited form of broadcast messaging may be employed to create "pattern groups." Messages with a "pattern group" ID in the destination field would be responded to by all instruments in a group assigned that ID. For example, all of the instruments that receive commands from a particular pattern generator may be assigned to one pattern group. In this way, a single message addressed generally to the pattern group would synchronize the watches in all of the instruments in the group.

An advantage of pattern group addressing is that it allows a user to program the tester with multiple "logical pattern generators." Each logical pattern generator could be programmed to have an independent test flow. For example, in testing a semiconductor device with a fast bus and a slow bus, the circuitry to generate and measure signals to test the fast bus may be on instruments assigned to one pattern group. The circuitry to generate and measure signals to test the slow bus may be on instruments assigned to a second pattern group. Both buses could be tested simultaneously, but the programs to test each bus could be written independently and stored in separate pattern generators for independent execution.

An instrument may belong to more than one pattern group, though arbitration may be employed in such a scenario to ensure that no single instrument simultaneously received inconsistent commands or more commands than it could process. For example, destination ID's that allow messages to be sent to instruments in multiple pattern groups would allow the pattern groups to be synchronized.

While the invention has been particularly shown and described with reference to the preferred embodiments thereof, it will be understood by those skilled in the art that various changes in form and detail may be made therein without departing from the spirit and scope of the invention.

For example, various physical implementations of a communication link are possible. SerDes lines are shown as single lines. Such lines used may be implemented with twisted pair, coax, optical fiber or any other suitable physical medium. Further, two lines may be used to allow two-way communication between pattern generators and event controllers. Or, a single duplexed line may be used. Alternatively, it may be adequate to provide for only one-way communication from pattern generators to event controllers. Moreover, it is not necessary that the communication link be serial. Other forms of communications networks may be used. It is described that a packet switched network is employed, but embodiments may be constructed using other types of networks.

Each instrument is shown to have one clock module. An instrument may have more than one clock module. Further, the described embodiment shows that each digital instrument includes a pattern generator. Not all digital instruments must have a pattern generator to obtain benefits of the invention. Some digital instruments may receive commands from pattern generators on other digital instruments. For example, some digital instruments may generate relatively low frequency patterns while others generate high frequency patterns. The low frequency instruments may receive commands from the higher frequency ones. Alternatively, some or all of the digital instruments may receive commands from a central pattern generator. Even when all digital instruments contain pattern generators, it still may be desirable for some digital instruments to send commands or status messages to others.

In FIG. 4B, prior to a synchronization of watches, a low resolution watch is used. After synchronization, WATCHB tracks time with a resolution equal to the period of LCLKB, i.e. a high resolution watch. Alternatives exist for implementing WATCHB and a LOW_RES watch. Separate hardware may be used to implement the low resolution and the high resolution watches. Alternatively, the same hardware may be used for both the low resolution watch and the low resolution portion of the high resolution watch.

Further, the ISL is shown to connect instruments to each other. Other parts of the system may be connected to the instruments through the ISL. For example, the master region board may be connected to the ISL to allow communication with instruments or to allow commands from computer work station 22 to be communicated over the ISL. The ISL is shown implemented with a router. A router is not required. Similar functionality may be provided with any packet switching circuit or circuit switching circuitry. Alternatively, every instrument may receive every packet and select only the packets addressed to it. However, having a router or similar switching circuit reduces the rate at which each instrument must process packets. It also facilitates broadcast addressing and pattern groups because each can be implemented by programming an address translation table in the switching circuitry without the need to reprogram logic on each instrument.

Where synchronization is achieved by aligning edges of two clocks, either clock may be delayed until one of its edges has the desired time relationship with an edge of the other clock. Likewise, clocks and other timing circuits may be implemented by circuits that count up or count down. Accordingly adding time values may result in larger or smaller numbers, depending on how the times are tracked.

Also, it is not necessary that all time un-stampers in a test system measure time with the same precision or that each time un-stamper measure time with the same precision as the time stamp in a message. It is possible that a time un-stamper may output an event indication when a local clock reaches a time equal to only some number of the most significant bits in the time stamp of a message. The time un-stamper may, along with an indication that an event is to be performed, provide to the functional circuit the remaining least significant bits of the time stamp. The functional part of the instrument may use the remaining least significant bits as an offset and execute the command at a time offset from the event signal by that amount.

Some time values are shown offset by multiple values. Also, various operations are described in which an offset is added to one of the time values on one instrument synchronized to another instrument. Coordinated operation may be achieved by subtracting the same amount from the other value. Neither the order nor the location in which offsets are combined is critical. For example, FIG. 5 shows remainder and latency values added to the outputs of local watches. These values could be introduced within the local watches. Or, these values may be introduced within the circuitry that generates the local clocks.

Also, it is described above that instruments are "synchronized." As used herein, instruments are synchronized when there is a deterministic time relationship between the operation of the instruments. With synchronized instruments, a tester should, within the timing accuracy of the tester, perform the same each time a test is repeated. In contrast, if the instruments are not synchronized, intervals between test functions executed by different instruments may vary from test to test by amounts greater than the timing accuracy of the tester. "Synchronized" does not, however, require that operations be coincident or simultaneous. Instruments may, for example, be considered to be synchronized even if there is some delay between a command executed on one instrument and an action taken on another instrument in response to that command.

Likewise, it is described that clocks are "aligned." Clocks are pictured as having coincident rising edges when aligned. Such a representation is for clarity of illustration. Two clocks may be considered aligned so long as some portion of one clock signal occurs with a deterministic time relationship to some portion of the other clock signal. Further, it is not necessary that this relationship be repeated in every cycle of the clocks. In cases where two clocks that have different periods, the relative position of edges of the two signals may change from cycle to cycle. However, if the clocks are aligned at some time, the relationship between edges is deterministic to within limits imposed by the stability of the signals.

Further, FIG. 4B illustrates WATCHA and WATCHB having the same most significant bits when synchronized. Such values are shown for simplicity. The watches may be considered synchronized even if there is some fixed offset between them. As described above, fixed offsets between timing of events in different channels of a test system may be readily calibrated out and do not create a source of error. Further, watches may be considered synchronized even if there are differences in the least significant bits at any given time. If WATCHA and WATCHB are clocked by local clocks of different frequencies, the watches will increment at different times and will increment by different amounts that are proportional to the period of the respective local clock clocking the watch. However, so long as timing of events is repeatable from test to test, the watches may be considered to be synchronized.

Further, FIGS. 4A and 4B illustrate that a synchronize watches command can be executed at any time that can be expressed in WATCHA, even if this time is specified with a resolution that cannot be transmitted or processed by WATCHB. If restrictions are placed on operation of the test system, simplifications may be placed on design of some of the circuitry. For example, if synchronize commands are only allowed to be performed at times that can be represented by the value in a time stamp, the need to store a remainder may be avoided. However, constraining the times at which the synchronize watches command may be undesirable.

As a further alternative, synchronization of watches may be achieved without storing a remainder value $R_2$ may be achieved by setting the least significant bits of the watch on the controller instrument to zero when the resynchronize watches command is executed. Such an approach is most useful in a system in which all watches are simultaneously resynchronized.

FIG. 3 shows three instruments connected through router 300. This number of connections is to demonstrate the principle of operation only. Likely, a tester would include more than three instruments.

Further, instruments are described as analog and digital instruments. Many instruments process both analog and digital signals and the specific type of instruments is not a limitation on the invention.

Such alterations, modifications, and improvements are intended to be part of this disclosure, and are intended to be within the spirit and scope of the invention. Accordingly, the foregoing description and drawings are by way of example only.

What is claimed is:

1. An instrument for an automatic test system in which a communication link carries messages, comprising:
   a) an interface comprising:
      i) a reference clock input;
      ii) a port to connect to the communication link;
   b) a clock generator, the clock generator coupled to the reference clock input and receiving a reference clock from the reference clock input and outputting a local clock;
   c) a timing circuit, clocked by the local clock, having an input to receive a value representative of a time and an output, the timing circuit asserting the output at a time represented by the value received at the input;
   d) a message processing circuit having an input coupled to the port and an output coupled to the input of the timing circuit;
   wherein the timing circuit includes a time-tracking sub-circuit that counts pulses of the local clock; and
   wherein the timing circuit comprises at least one comparator circuit having an output coupled to the output of the timing circuit, the comparator having a first input coupled to the output of the message processing circuit and a second input coupled to the time-tracking sub-circuit.

2. The instrument of claim 1 wherein the clock generator comprises a DDS circuit.

3. The instrument of claim 1 wherein the message processing circuit is adapted to receive packets asynchronously over the communication link.

4. The instrument of claim 1 wherein the port comprises a serial port.

5. The instrument of claim 1 wherein the interface, clock generator, timing circuit and message processing circuit are implemented as a single integrated circuit chip.

6. The instrument of claim 1 additionally comprising a second time tracking sub-circuit that counts pulses of the reference clock.

7. The instrument of claim 1 additionally comprising functional circuitry having a command input, coupled to the output of the timing circuit, wherein the functional circuitry executes a test function in response to the output of the timing circuit being asserted.

8. The instrument of claim 1 wherein the interface additionally comprises a synchronization input and the clock generator includes circuitry to track periods of the reference clock starting at a time dictated by the synchronization input.

9. An integrated circuit comprising an interface adapted for use in an instrument for automatic test equipment having functional circuitry that executes a function in response to a command, comprising
   a) a reference clock input;
   b) a communication link input;
   c) a command output;
   d) a clock generator, the clock generator coupled to the reference clock input and outputting a local clock;
   e) a timing circuit, clocked by the local clock, having an input to receive a value representative of a time and an output coupled to the command output, the timing circuit asserting the output at a time represented by a value applied to the input of the timing circuit, and wherein the timing circuit comprises:
      i) a counter counting pulses of the local clock; and
      ii) a second counter counting pulses of a signal at the reference clock input; and
   f) a message processing circuit having an input coupled to the communication link input and an output coupled to the input of the timing circuit.

10. The integrated circuit of claim 9 implemented as an ASIC.

11. The integrated circuit of claim 9 wherein the message processing circuit comprises a network interface.

12. The integrated circuit of claim 11 wherein the message processing circuit comprises an interface to a serial line in a network.

13. An instrument for an automatic test system in which a communication link carries messages, comprising:
   a) an interface comprising:
      i) a reference clock input;
      ii) a port to connect to the communication link;
   b) a clock generator, the clock generator coupled to the reference clock input and receiving a reference clock from the reference clock input and outputting a local clock;
   c) a timing circuit, clocked by the local clock, having an input to receive a value representative of a time and an output, the timing circuit asserting the output at a time represented by the value received at the input, and wherein the timing circuit includes a time-tracking sub-circuit that counts pulses of the local, clock;
   d) a message processing circuit having an input coupled to the port and an output coupled to the input of the timing circuit; and
   e) a second time tracking sub-circuit that counts pulses of the reference clock.

14. The instrument of claim 13, wherein the message processing circuit is adapted to receive packets asynchronously.

15. The instrument of claim 13, wherein the interface, clock generator, timing circuit, and message processing circuit are implemented as a single integrated circuit chip.

16. The instrument of claim 13, additionally comprising functional circuitry having a command input, coupled to the output of the timing circuit, wherein the functional circuitry executes a test function in response to the output of the timing circuit being asserted.

17. The instrument of claim 13 wherein the interface additionally comprises a synchronization input and the clock generator includes circuitry to track periods of the reference clock starting at a time dictated by the synchronization input.

18. An integrated circuit comprising an interface adapted for use in an instrument for automatic test equipment having functional circuitry that executes a function in response to a command, comprising
   a) a reference clock input;
   b) a communication link input;
   c) a command output;
   d) a clock generator including an accumulator, the clock generator coupled to the reference clock input and outputting a local clock;
   e) a timing circuit, clocked by the local clock, having an input to receive a value representative of a time and an output coupled to the command output, the timing circuit asserting the output at a time represented by a value applied to the input of the timing circuit;
   f) a message processing circuit having an input coupled to the communication link input and an output coupled to the input of the timing circuit, the output of the message processing circuit including a time stamp, the time stamp having at least a first field and a second field, each of the first field and the second field having a value; and g) a circuit to compute a value based on the value of the first field and to load the computed value into the accumulator at a time based on the value of the second field in response to an output of the timing circuit.

19. The integrated circuit of claim 18 implemented as an ASIC.

20. The integrated circuit of claim 18, wherein the message processing circuit comprises a network interface.

* * * * *